US012684909B2

(12) United States Patent
Zhu et al.

(10) Patent No.: US 12,684,909 B2
(45) Date of Patent: Jul. 14, 2026

(54) LIGHT-EMITTING DIODE AND LIGHT-EMITTING DEVICE INCLUDING THE SAME

(71) Applicant: XIAMEN SAN'AN OPTOELECTRONICS CO., LTD., Hongtang Town (CN)

(72) Inventors: Xiushan Zhu, Xiamen (CN); Yan Li, Xiamen (CN)

(73) Assignee: XIAMEN SAN'AN OPTOELECTRONICS CO., LTD., Hongtang Town (CN)

( * ) Notice: Subject to any disclaimer, the term of this patent is extended or adjusted under 35 U.S.C. 154(b) by 777 days.

(21) Appl. No.: 17/930,103

(22) Filed: Sep. 7, 2022

(65) Prior Publication Data

US 2023/0096346 A1    Mar. 30, 2023

(51) Int. Cl.
H10H 20/831 (2025.01)
H10H 20/814 (2025.01)
H10H 20/857 (2025.01)

(52) U.S. Cl.
CPC ...... H10H 20/8312 (2025.01); H10H 20/814 (2025.01); H10H 20/857 (2025.01)

(58) Field of Classification Search
CPC ............ H10H 20/8312; H10H 20/857; H10H 20/814; H10H 20/841; H10D 86/0227; H10D 84/8316
See application file for complete search history.

(56) References Cited

U.S. PATENT DOCUMENTS

2018/0040767 A1*   2/2018   Jang ..................... H10H 20/825
2019/0296204 A1*   9/2019   Oh ........................ H10H 20/856

* cited by examiner

*Primary Examiner* — Bumsuk Won
(74) *Attorney, Agent, or Firm* — Thomas Horstemeyer, LLP

(57) ABSTRACT

A light-emitting diode includes an epitaxial structure, at least one via hole, a first insulation layer, a first connecting electrode, a second connecting electrode, a second insulation layer, a first pad, and a second pad. The first insulation layer includes a first insulation portion and a second insulation portion such that an upper surface of the first connecting electrode and an upper surface of the second connecting electrode are disposed on the same level so as to ensure that an upper surface of the first pad and an upper surface of the second pad are also on the same level.

17 Claims, 12 Drawing Sheets

LIGHT-EMITTING DIODE AND LIGHT-EMITTING DEVICE INCLUDING THE SAME

CROSS-REFERENCE TO RELATED APPLICATION

This application claims priority of Chinese Invention Patent Application No. 202111138111.5, filed on Sep. 27, 2021. The entire content of the patent application is incorporated herein by reference.

FIELD

The disclosure relates to a light-emitting diode, and more particularly to a light-emitting diode having high flatness. The disclosure also relates to a light-emitting device including the light-emitting diode

BACKGROUND

Light emitting diodes (LEDs) offer several advantages, such as low cost, high luminous efficiency, energy saving, environmental protection, and the like, and thus are widely used in various applications, such as lighting, visible light communication, luminous display, and the like. LED chips are generally classified into three categories: face-up, flip-chip, and vertical. Compared to the face-up LED chips, the flip-chip LED chips are configured with an inverted diode structure, in which light is emitted from a substrate (e.g., sapphire) and electrodes are fixed on the substrate with better thermal dissipation efficiency.

Currently, in the flip-chip LED chip, a metal reflective layer or an insulating reflective layer is disposed almost entirely on a side of an epitaxial structure of the chip, such that light is emitted primarily from a surface and a sidewall of the substrate of the flip-chip type LED chip. The metal reflective layer delivers better performance in terms of current spreading and thermal dissipation compared to the insulating reflective layer, and is used primarily in luminous LED chips with a high driving current. The epitaxial structure of the flip-chip LED chip with the metal reflective layer has via holes that extend, for example, from a P-type layer to an N-type layer. Metal layers (including the metal reflective layer) and insulating protection layers (including the insulating reflective layer) disposed on a side of the epitaxial structure are configured as a multi-layered structure and have a great thickness, which causes pad electrodes covering the via holes of the epitaxial structure to have low surface flatness and significant height difference. The height difference may be greater than 4 µm. In addition, the metal layers having different polarities overlap each other in some areas thereof in a longitudinal direction, which may result in some issues. For example, the pad electrodes having significant height difference may have a high void rate after die-bonding, which may in turn lead to a reduced thrust and lower thermal dissipation efficiency. In addition, when the chip is applied with an external force during and/or after die-bonding, the insulating layer may crack easily due to the brittle nature thereof, which may lead to a partial short-circuit since the metal layers having different polarities are interconnected. Therefore, improving the surface flatness and thickness consistency of the pads of the flip-chip LED chip becomes desirable in avoiding the interconnection between the metal layers with different polarities, which results from cracking of the insulating layer.

SUMMARY

An object of the disclosure is to provide a light-emitting diode that can alleviate or overcome at least one of the aforesaid shortcomings of the prior art.

According to the disclosure, a light-emitting diode includes an epitaxial structure, at least one via hole, a first insulation layer, a first connecting electrode, a second connecting electrode, a second insulation layer, a first pad, and a second pad.

The epitaxial structure includes a first semiconductor layer, a light-emitting layer disposed on the first semiconductor layer, and a second semiconductor layer disposed on the light-emitting layer.

The at least one via hole extends downwardly from a portion of an upper surface of the second semiconductor layer and through the light-emitting layer to terminate at the first semiconductor layer.

The first insulation layer includes a first insulation portion and a second insulation portion. The first insulation portion is disposed over a portion of the second semiconductor layer and extends to a bottom of the at least one via hole. The first insulation portion is formed with at least one first opening disposed at the bottom of the at least one via hole. The second insulation portion is disposed only over a portion of the second semiconductor layer. The first insulation portion is disposed to surround the second insulation portion. The first insulation portion and the second insulation portion are separated from each other by a second opening formed as a shape surrounding the second insulation portion.

The first connecting electrode is disposed on the first insulation portion and is electrically connected to the first semiconductor layer through the at least one first opening.

The second connecting electrode covers an upper surface and a sidewall of the second insulation portion and is electrically connected to the second semiconductor layer through the second opening. An upper surface of the second connecting electrode is on the same level as that of the first connecting electrode.

The second insulation layer is disposed on the first connecting electrode and the second connecting electrode, and is provided with a third opening and a fourth opening.

The first pad is disposed on the first connecting electrode, and is electrically connected to the first connecting electrode through the third opening.

The second pad is disposed on the second connecting electrode, and is electrically connected to the second connecting electrode through the fourth opening.

Another object of the disclosure is to provide a light-emitting device including the light-emitting diode.

The first insulation portion and the second insulation portion are provided in the light-emitting diode of the disclosure such that the upper surface of the first connecting electrode is on the same level as that of the second connecting electrode, so as to ensure that an upper surface of the first pad and an upper surface of the second pad are also on the same level. Therefore, the light-emitting device obtained has a high level of flatness.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

Figure 1:
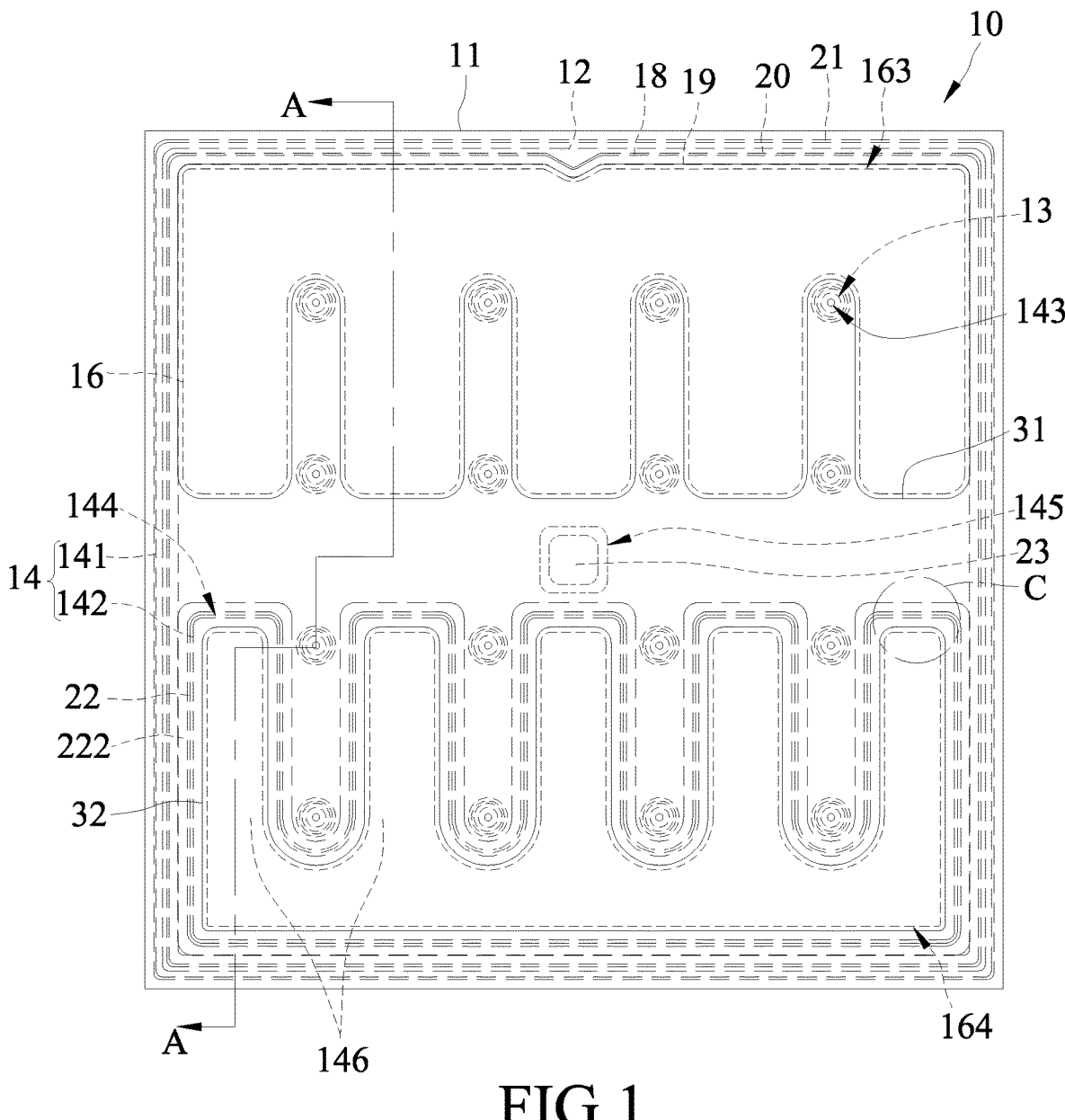
FIG. 1 is a schematic top view of a first embodiment of a light-emitting diode (LED) according to the disclosure.

Before the disclosure is described in greater detail, it should be noted that where considered appropriate, reference numerals have been repeated among the figures to indicate corresponding or analogous elements, which may optionally have similar characteristics.

Figure 2:
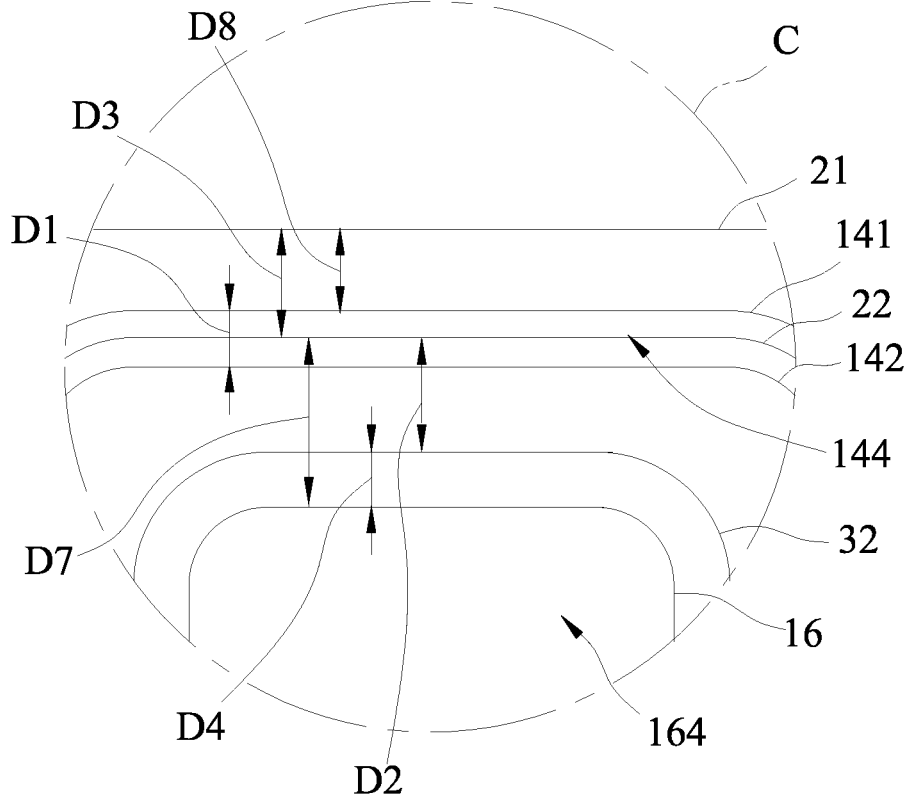
FIG. 2 is an enlarged schematic view of a portion indicted by character "C" in FIG. 1.
Figure 3:
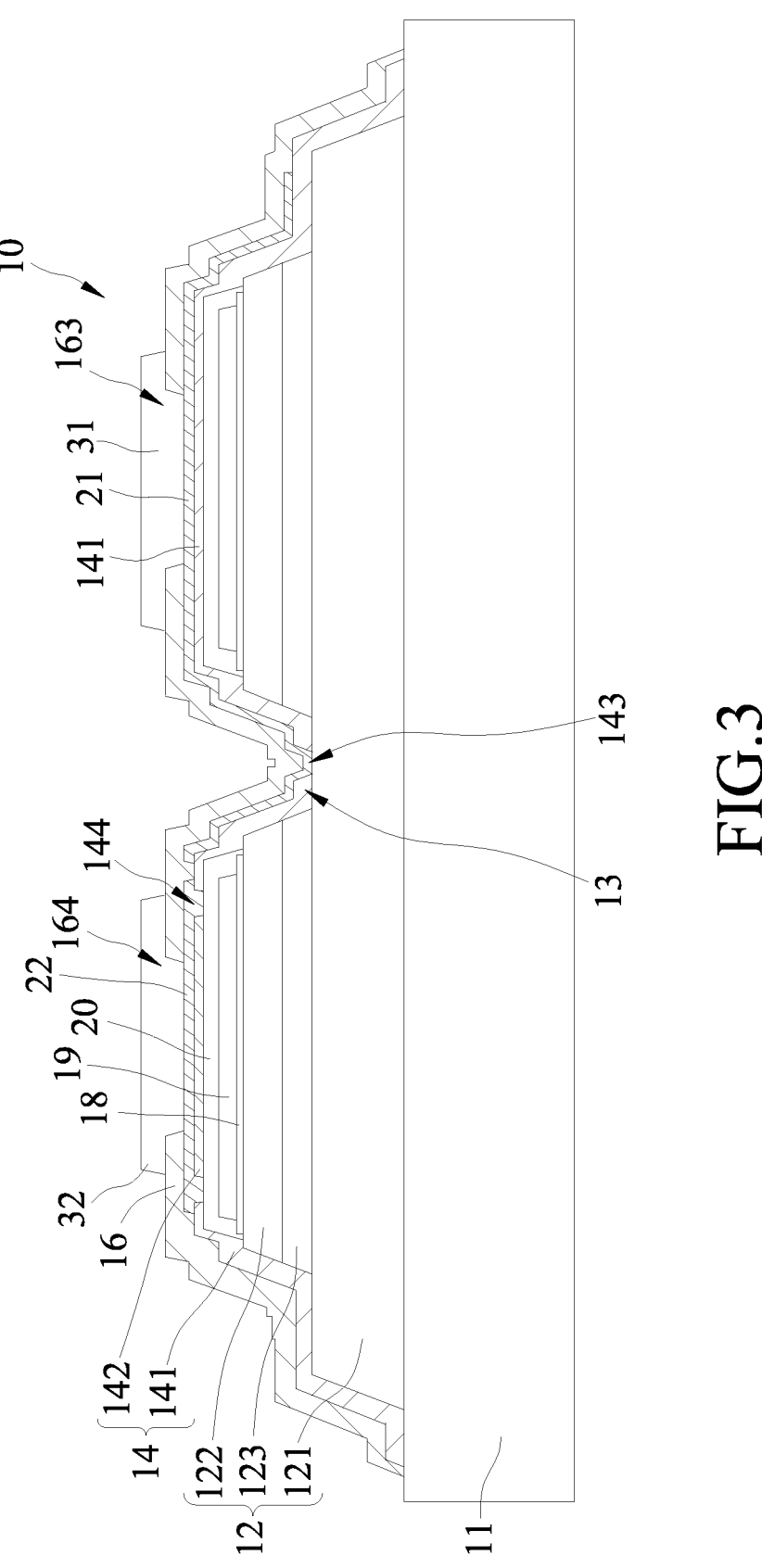
FIG. 3 is a schematic sectional view taken along line A-A of FIG. 1.

Referring to FIGS. 1 to 3, a first embodiment of a light-emitting diode (LED) 10 according to the disclosure includes a substrate 11, an epitaxial structure 12, at least one via hole 13, a transparent conductive layer 18, a reflective layer 19, a blocking layer 20, a first insulation layer 14, a second insulation layer 16, a first connecting electrode 21, a second connecting electrode 22, a bump 23, a first pad 31, and a second pad 32.

The epitaxial structure 12 is provided on the substrate 11. The substrate 11 may be a transparent substrate, an opaque substrate, or a translucent substrate. The transparent substrate or the translucent substrate permits light emitted from a light-emitting layer 123 to pass through the substrate 11 and to reach one side of the substrate 11 distal from the epitaxial structure 12. The substrate 11 may be, for example, but not limited to, a polished sapphire substrate, a patterned sapphire substrate, a silicon substrate, a silicon carbide substrate, a gallium nitride substrate, or a glass substrate.

The epitaxial structure 12 includes a first semiconductor layer 121, the light-emitting layer 123 disposed on the first semiconductor layer 121, and a second semiconductor layer 122 disposed on the light-emitting layer 123.

The first semiconductor layer 121 is connected to the substrate 11, and is a layer grown on the substrate 11. The first semiconductor layer 121 may be a semiconductor layer doped with an N-type dopant, for example, but not limited to, a gallium nitride semiconductor layer doped with silicon (Si).

The light-emitting layer 123 may have a single quantum well structure or a multiple quantum well structure. A wavelength of the light generated by the light-emitting layer 123 is determined by a composition and/or a thickness of a well layer of the light-emitting layer 123. Specifically, the light-emitting layer 123 generating specific light, for example, ultraviolet light, blue light, green light, or the like, may be provided by adjusting the composition of the well layer.

The second semiconductor layer 122 may be a semiconductor layer doped with a P-type dopant, for example, a gallium nitride semiconductor layer doped with magnesium (Mg). Each of the first semiconductor layer 121 and the second semiconductor layer 122 may be configured as a single-layered structure or a multi-layered structure, and may include a superlattice layer. The first semiconductor layer 121, the light-emitting layer 123, and the second semiconductor layer 122 may sequentially be formed on the substrate 11 by a metal organic chemical vapor deposition (MOCVD) process, a molecular beam epitaxial (MBE) process, or the like. In addition, in the case where the first semiconductor layer 121 is doped with the P-type dopant, the second semiconductor layer 122 is doped with the N-type dopant. A transition layer and/or a buffering layer (not shown), for example, but not limited to, an aluminum nitride layer or a gallium nitride layer, may be disposed between the first semiconductor layer 121 and the substrate 11, so as to enhance the forming of the first semiconductor layer 121, the light-emitting layer 123, and the second semiconductor layer 122 on the substrate 11 in terms of quality.

The via hole 13 extends downwardly from a portion of an upper surface of the second semiconductor layer 122 and through the light-emitting layer 123 to terminate at the first semiconductor layer 121. That is to say, the via hole 13 penetrates through the second semiconductor layer 122 and the light-emitting layer 123 to terminate at the first semiconductor layer 121, so as to expose a portion of the first semiconductor layer 121. A horizontal area of the first semiconductor layer 121 is greater than that of the light-emitting layer 123 and is also greater than that of the second semiconductor layer 122. Referring to FIG. 1, the LED 10 may be provided with a plurality of the via holes 13 and a plurality of first openings 143 disposed respectively to the via holes 13. Each of the via holes 13 may be configured to have, for example, but not limited to, a circular shape. There is no limit to the shape and the number of the via holes 13. When a plurality of the via holes are provided, the current can be spread more evenly and more effectively. In addition, the via holes 13 may be evenly or unevenly spaced apart from each other in accordance with actual requirements in practice.

The transparent conductive layer 18 is disposed on the second semiconductor layer 122 and is in direct contact with the second semiconductor layer 122. The transparent conductive layer 18 is disposed in a position offset from the via holes 13, and is formed almost entirely on the second semiconductor layer 122. The transparent conductive layer 18 is formed using a transparent conductive oxide material so as to achieve an ohmic contact and a transverse current spreading.

The reflective layer 19 is disposed on the second semiconductor layer 122. Specifically, the reflective layer 19 is disposed directly on the transparent conductive layer 18. The reflective layer 19 is in contact with the transparent conductive layer 18, and is used to reflect the light, which is generated from the light-emitting layer 123 and travels upwardly toward the substrate 11. A proportion of a horizontally projected area of the reflective layer 19 to that of the second semiconductor layer 122 is at least 80%. In other words, the reflective layer 19 covers at least 80% of the second semiconductor layer 122 in terms of area. It is desirable to have a great portion of the horizontally projected area of the second semiconductor layer 122 being covered by the reflective layer 19. The blocking layer 20 is provided on the reflective layer 19, and covers a top surface and a sidewall of the reflective layer 19 so as to protect the reflective layer 19.

The first insulation layer 14 covers the blocking layer 20 disposed on the epitaxial structure 12 and a sidewall of the epitaxial structure 12, and extends to cover a portion of the substrate 11 around the epitaxial structure 12. The first insulation layer 14 includes a first insulation portion 141 and a second insulation portion 142, and is provided with a plurality of the first openings 143, a second opening 144, and an ejector pin opening 145. The second opening 144 and the ejector pin opening 145 are disposed on the blocking layer 20. The first insulation portion 141 is disposed on the blocking layer 20 that is disposed over a portion of the second semiconductor layer 122, and extends to bottoms of the via holes 13. The first insulation portion 141 is formed with the first openings 143 disposed at the bottoms of the via holes 13, respectively. In other words, the first openings 143 of the first insulation portion 141 are disposed in the via holes 13, respectively.

The second insulation portion 142 is disposed only over a portion of the second semiconductor layer 122. Referring to FIG. 1, the first insulation portion 141 is disposed to surround the second insulation portion 142, and the first insulation portion 141 and the second insulation portion 142 are separated from each other by the second opening 144 formed as a shape that surrounds the second insulation portion 142. Since the second insulation portion 142 is disposed only over a portion of the second semiconductor layer 122, the second insulation portion 142 does not overlap the via holes 13, such that the second connecting electrode 22 and the second pad 32 disposed over the second insulation portion 142 are disposed in positions offset from the via holes 13 so as to ensure that the first pad 31 has an upper surface which is on the same level as that of the second pad 32. The second opening 144 is disposed over the second semiconductor layer 122.

Specifically, the first insulation portion 141 and the second insulation portion 142 are disposed to cover the blocking layer 20. The first openings 143 of the first insulation portion 141 are disposed in the via holes 13, respectively. The second opening 144 exposes a portion of the blocking layer 20. The second connecting electrode 22 is electrically connected to the blocking layer 20 through the second opening 144.

The first insulation layer 14 performs different functions depending on the position involved. For example, a portion of the first insulation layer 14 covering the sidewall of the epitaxial structure 12 is used, for example, but not limited to, to prevent leakage of a conductive material, which will cause an electrical connection between the first semiconductor layer 121 and the second semiconductor layer 122, and to avoid abnormalities such as short-circuit in the LED 10.

The first connecting electrode 21 is disposed on the first insulation portion 141 and extends to the bottoms of the first openings 143, so as to be electrically connected to the first semiconductor layer 121. The first connecting electrode 21 does not overlap the second opening 144. The second connecting electrode 22 covers an upper surface and a sidewall of the second insulation portion 142. That is to say, the second connecting electrode 22 entirely covers the second insulation portion 142, and an edge portion of the second connecting electrode 22 extends into the second opening 144 so as to be electrically connected to the second semiconductor layer 122. Most of the second connecting electrode 22 is supported by the second insulation portion 142, and the second connecting electrode 22 is in contact with the blocking layer 20 by passing across a peripheral portion of the second insulation portion 142. In some embodiments, the second connecting electrode 22 entirely covers the second insulation portion 142. That is to say, the second connecting electrode 22 covers the upper surface and the sidewall of the second insulation portion 142. In some embodiments, the edge portion of the second connecting electrode 22 is disposed in the second opening 144. An upper surface of the second connecting electrode 22 is on the same level as that of the first connecting electrode 21.

The second insulation layer 16 is disposed on the first connecting electrode 21 and the second connecting electrode 22, and is provided with a third opening 163 and a fourth opening 164. The third opening 163 is disposed on the first connecting electrode 21. The fourth opening 164 is disposed on the second connecting electrode 22. The second insulation layer 16 further covers a sidewall of the epitaxial structure 12.

In some embodiments, a minimum distance between an edge of the second opening 144 and that of the fourth opening 164 ranges from 10 μm to 30 μm, so as to increase an area of the second pad 32 by as much as possible.

The first pad 31 is disposed on the first connecting electrode 21. The second pad 32 is disposed on the second connecting electrode 22. The first pad 31 is electrically connected to the first connecting electrode 21 through the third opening 163. The second pad 32 is electrically connected to the second connecting electrode 22 through the fourth opening 164. The first pad 31 and the second pad 32 may be formed together in a same process using a same material, and may therefore have a same layered configuration. Each of the first pad 31 and the second pad 32 may be configured as a comb-like metal layer. For example, the first pad 31 may be an N-type pad, and the second pad 32 may be a P-type pad.

In the LED 10, the first connecting electrode 21 is supported by the first insulation portion 141, and the second connecting electrode 22 is supported by the second insulation portion 142, such that the upper surface of the first connecting electrode 21 is on the same level as that of the second connecting electrode 22, so as to ensure that an upper surface of the first pad 31 disposed on the first connecting electrode 21 is on the same level as that of the second pad 32 disposed on the second connecting electrode 22. Therefore, the LED 10 obtained may have a high level of flatness.

In some embodiments, the first insulation portion 141 has a thickness ranging from 0.8 μm to 1.5 μm. The first insulation 141 is greater in thickness, and thus may better insulate the first connecting electrode 21, which has a greater area, from the blocking layer 20 disposed therebelow.

In some embodiments, a distance between the first connecting electrode 21 and the second opening 144 ranges from 10 μm to 20 μm. If the distance is less than 10 μm, the first connecting electrode 21 and a portion of the blocking layer 20 disposed below the second opening 144 will become too close to each other, which may lead to a poor performance in electrostatic discharge (ESD). The edge portion of the second connecting electrode 22 is disposed to extend into the second opening 144. A distance between the first connecting electrode 21 and the second connecting electrode 22 ranges from 10 μm to 50 μm, such that an electrical isolation therebetween may be maintained. A distance between the second insulation portion 142 and the second connecting electrode 22 ranges from 5 μm to 20 μm. If the distance between the second insulation portion 142 and the second connecting electrode 22 is less than 5 μm, a current injection area will become smaller such that a voltage may be affected. If the distance between the second insulation portion 142 and the second connecting electrode 22 is greater than 20 μm, an area of the second insulation portion 142 will decrease relatively, such that an area of the second insulation portion 142 for supporting the second pad 32 will also decrease relatively and so will the flatness of the second pad 32.

In addition, when the second pad 32 is subjected to an external force that causes the second insulation portion 32 disposed therebelow to crack, since the second insulation portion 142 is separated from the first insulation portion 141 by the second opening 144, cracking of the second insulation portion 142 would not also cause cracking of the first insulation portion 141 due to an effect of internal stress transport, as one might have imagined. In other words, the crack produced in the second insulation portion 142 may be prevented from extending to the first insulation portion 141. Therefore, a partial short-circuit caused by the interconnection between the first connecting electrode 21 and the blocking layer 20 disposed below the first insulation portion 141 may be avoided to a certain extent.

In some embodiments, referring to FIG. 1, the second insulation portion 142 and the first insulation portion 141 are separated from each other. The second insulation portion 142 and the second opening 144 are configured as a comb-like shape. Specifically, the second insulation portion 142 includes a plurality of protrusion parts 146 extending horizontally toward the first pad 31. At least one of the via holes 13 is provided between two adjacent ones of the protrusion parts 146 to enhance the support of the second insulation portion 142 for the second connecting electrode 22 and to permit the second insulation portion 142 to bypass the via holes 13, so as to ensure the surface flatness of the second connecting electrode 22 and to ensure a high film density and a high film continuity of the second connecting electrode 22. Spacing distances among the protrusion parts 146 may be equal. In some embodiments, the second connecting electrode 22 may be configured the same as the second insulation portion 142 in shape. In other words, the second connecting electrode 22 may also include a plurality of protrusion parts 222 configured the same as the protrusion parts 146 of the second insulation portion 142 in shape. The protrusion parts 222 entirely cover the protrusion parts 146, respectively, so as to enhance the performance of current spreading. At least one of the via holes 13 is provided between two adjacent ones of the protrusion parts 222. The protrusion parts 222 are disposed in positions offset from the via holes 12 to ensure that the first pad 31 and the second pad 32 are disposed on a same level.

In some embodiments, referring to FIG. 1, the upper surface of the first connecting electrode 21 and the upper surface of the second connecting electrode 22 are disposed on the same level as much as possible, so as to ensure the first pad 31 and the second pad 32, which are disposed on the first connecting electrode 21 and the second connecting electrode 22, respectively, are also on the same level. In the case where the second insulation portion 142 includes a plurality of the protrusion parts 146, the first connecting electrode 21 and the second connecting electrode 22 are almost entirely disposed on the first insulation portion 141 and the second insulation portion 142 of the first insulation layer 14, respectively. The first connecting electrode 21 and the second connecting electrode 22 are formed on the first insulation portion 141 and the second insulation portion 142, respectively in large areas, so as to ensure that the upper surfaces of the first connecting electrode 21 and the second connecting electrode 22 are on the same level as much as possible. Specifically, a horizontally projected area of the second insulation portion 142 is at least 50% of that of second connecting electrode 22. In some embodiments, it is desirable to have a higher proportion of the horizontally projected area of the second insulation portion 142 to that of the second connecting electrode 22. The horizontally projected area of the second insulation portion 142 may be at least 80% (for example, but not limited to, 80% or 90%) of that of the second connecting electrode 22.

A horizontally projected area of a component (for example, the first connecting electrode 21 or the like) refers to a projected area on a horizontal surface of the LED 10 when the component is projected along a transverse direction transverse to the horizontal surface of the LED 10.

In some embodiments, referring to FIGS. 1 and 2, in the case where the second insulation portion 142 includes a plurality of the protrusion parts 146, the horizontally projected areas of the second insulation portion 142 is less than 100% of that of the second connecting electrode 22. A distance (D1) is defined between an edge of the first insulation portion 141 and an edge of the second insulation portion 142. The distance (D1) is also a width of the second opening 144. The distance (D1) ranges from 5 μm to 20 μm so as to permit the second connecting electrode 22 to be electrically connected to the blocking layer 20 through the second opening 144 and to be further electrically connected to the second semiconductor layer 122. In addition, the second opening 144 is designed to facilitate electric current transmission between the second connecting electrode 22 and the blocking layer 20 through the second opening 144 and to rapidly spread electric current from a bottom of the second connecting electrode 22 through the blocking layer 20, so as to enhance brightness uniformity and the absolute brightness value of the LED 10.

In some embodiments, referring to FIG. 1, to ensure the insulating effectiveness of the first insulation layer 14 on the epitaxial structure 12, the horizontally projected area of the second insulation portion 142 may range from 30% to 70% of that of the first insulation portion 141 according to the area requirement of the second connecting electrode 22.

In some embodiments, referring to FIGS. 1 and 2, in the case where the second insulation portion 142 includes a plurality of the protrusion parts 146 and where the second opening 144 is configured as the comb-like shape, a distance (D3) is defined between an edge of the first connecting electrode 21 and an edge of the second connecting electrode 22. The distance (D3) ranges from 10 μm to 50 μm.

The third opening 163 of the second insulation layer 16 is disposed over the first insulation portion 141. The fourth opening 164 of the second insulation layer 16 is disposed over the second insulation portion 142.

In order for the first pad 31 and the second pad 32 to be on the same level, the third opening 163 is formed on a surface of the first connecting electrode 21 by as large an area as possible, and the fourth opening 164 is formed on a surface of the second connecting electrode 22 by as large an area as possible, such that the first pad 31 may fill the third opening 163 as much as possible, such that the second pad 32 may fill the fourth opening 164 as much as possible, and such that an overall performance of heat dissipation of the LED 10 may be enhanced. The third opening 163 is disposed on the first connecting electrode 21. The fourth opening 164 is disposed on the second connecting electrode 22. In some embodiments, the third opening 163 and the fourth opening 164 are designed to be disposed in positions offset from the via holes 1, the third opening 163 and the fourth opening 164 have same shapes and similarly-sized areas, and the first pad 31 and the second pad 32 have same shapes and similarly-sized areas. In some embodiments, an area of the first pad 31 is at least 80% of that of the second pad 32.

In some embodiments, referring to FIG. 1, to ensure that each of the first pad 31 and the second pad 32 has a flat surface and to ensure a low void rate in an installation process, in the case where the second insulation portion 142 includes a plurality of the protrusion parts 146, the first pad 31 and the second pad 32 do not overlap the via holes 13.

In some embodiments, referring to FIGS. 1 and 2, a proportion of the horizontally projected area of the third opening 163 of the second insulation layer 16 to that of the first pad 31 ranges from 80% to 100%. That is to say, the third opening 163 is filled with the first pad 31 almost entirely. A proportion of the horizontally projected area of the fourth opening 164 to that of the second pad 32 ranges from 80% to 100%. That is to say, the fourth opening 164 is filled with the second pad 32 almost entirely. The first pad 31 is disposed over the first insulation portion 141 and the second pad 32 is disposed over the second insulation portion 142, so as to ensure that the first pad 31 and the second pad 32 are absolutely flat.

In some embodiments, the proportion of the horizontally projected area of the third opening 163 of the second insulation layer 16 to that of the first pad 31 is greater than 100% and up to 110%. The proportion of the horizontally projected area of the fourth opening 164 to that of the second pad 32 is greater than 100% and up to 110%. The third opening 163 is filled with the first pad 31, so as to permit an edge portion of the first pad 31 to extend with a smaller width to cover a portion of the second insulation layer 16 surrounding the third opening 163. The fourth opening 164 is filled with the second pad 32, so as to permit an edge portion of the second pad 32 to extend with a smaller width to cover a portion of the second insulation layer 16 surrounding the fourth opening 164.

Referring to FIGS. 1-3, in the case where the second insulation portion 142 includes a plurality of the protrusion parts 146 and where the second opening 144 is configured as the comb-like shape, the edge portion of the second pad 32 extends to cover the second insulation layer 16 and a distance (D4) is defined between an edge of the second pad 32 and an edge of the fourth opening 164. The distance (D4) ranges from 5 μm to 20 μm. A distance (D7) is defined between an edge of the fourth opening 164 and an edge of the second connecting electrode 22. The distance (D7) ranges from 20 μm to 40 μm. A distance (D8) is defined between an edge of the second opening 144 proximate to the first insulation portion 141 and the first connecting electrode 21. The distance (D8) ranges from 10 μm to 20 μm.

In some embodiments, referring to FIG. 1, to prevent the first insulation layer 14 or the second insulation layer 16 from cracking, which may lead to a partial short-circuit since a pad and a connecting electrode having different polarities and disposed over each other are interconnected. In some alternative embodiments, the first connecting electrode 21 is disposed around the second pad 32, the second pad 32 does not overlap the first connecting electrode 21, the first pad 31 does not overlap the second connecting electrode 22, the second pad 32 is disposed only on the second connecting electrode 22, the proportion of the horizontally projected area of the second pad 32 to that of the second connecting electrode 22 is at least 90% and less than 100%, and the first pad 31 is disposed only on the first connecting electrode 21 so as to form the second pad 32 having an area as large as possible on the second connecting electrode 22.

In some embodiments, due to the requirement of disposing the pads on the same level, the horizontally projected area of the second pad 32 should not exceed that of the second connecting electrode 22. The horizontally projected area of the second pad 32 is less than that of the second connecting electrode 22.

Referring to FIGS. 1 and 2, in the case where the second insulation portion 142 includes a plurality of the protrusion parts 146, an area of the second pad 32 is in smaller than that of the second connecting electrode 22, and the second connecting electrode 22 is disposed below the second pad 32. A distance (D2) is defined between an edge of the second connecting electrode 22 and an edge of the second pad 32. The distance (D2) ranges from 15 μm to 50 μm.

In some embodiments, the transparent conductive layer 18 is formed using a transparent conductive oxide material so as to achieve an ohmic contact and transverse current spreading. The transparent conductive oxide material may include, for example, but not limited to, indium tin oxide (ITO), indium zinc oxide (IZO), indium oxide (InO), tin oxide (SnO), cadmium tin oxide (CTO), antimony tin oxide (ATO), aluminum zinc oxide (AZO), zinc tin oxide (ZTO), gallium-doped zinc oxide (GZO), tungsten-doped indium oxide (IWO), or zinc oxide (ZnO). In some embodiments, the transparent conductive layer 18 has a thickness ranging from 10 μm to 150 μm. In some embodiments, the thickness ranges from 30 μm to 120 μm.

Each of the reflective layer 19 and the blocking layer 20 is formed using a metal material. In some embodiments, the reflective layer is formed using silver, aluminum, titanium, tungsten, titanium-tungsten alloy, nickel, or combinations thereof. In some embodiments, the blocking layer 20 is formed using chromium, titanium, nickel, gold, aluminum, platinum, or combinations thereof.

In some embodiments, the reflective layer 19 is formed using silver. When the current passes through the reflective layer 19, silver may migrate due to factors such as heat, electricity, or the like. Therefore, the reflective layer 19 should be protected from migration of the material thereof. When the material of the reflective layer 19 migrates, metal ions such as silver or aluminum ions may diffuse into a chip in a disordered or ordered manner, resulting in partial leakage and causing a failure of the chip.

In some embodiments, each of the first insulation layer 14 and the second insulation layer 16 includes a non-conductive material. In some embodiments, the non-conductive material includes an inorganic material or a dielectric material. The inorganic material includes, for example, but not limited to, silicone, glass, or a combination thereof. The dielectric material includes an insulation material, for example, but not limited to, aluminum oxide (AlO), silicon nitride (SiNx), silicon oxide (SiOx), titanium oxide (TiOx), magnesium fluoride (MgF₂), or combinations thereof. In some embodiments, the first insulation layer 14 may include, for example, but not limited to, silicon dioxide, silicon nitride, titanium oxide, tantalum oxide, niobium oxide, barium titanate, or combinations thereof. The first insulation layer 14 may be configured as a distributed Bragg reflector (DBR) structure in which two different materials are stacked over each other. Materials and structures of the first insulation layer 14 and the second insulation layer 16 may be the same or different from each other.

In some embodiments, each of the first connecting electrode 21 and the second connecting electrode 22 may be configured as a titanium layer, an aluminum layer, a gold layer, a platinum layer, a chromium layer, a nickel layer, or laminates thereof. Each of the first pad 31 and the second pad 32 may include, for example, but not limited to, an aluminum layer, a titanium layer, a nickel layer, a gold layer, a gold-tin layer, or combinations thereof.

FIGS. 4 to 11 are schematic top views illustrating consecutive steps of a method for manufacturing the first embodiment of the LED 10 according to the disclosure.

Figure 4:
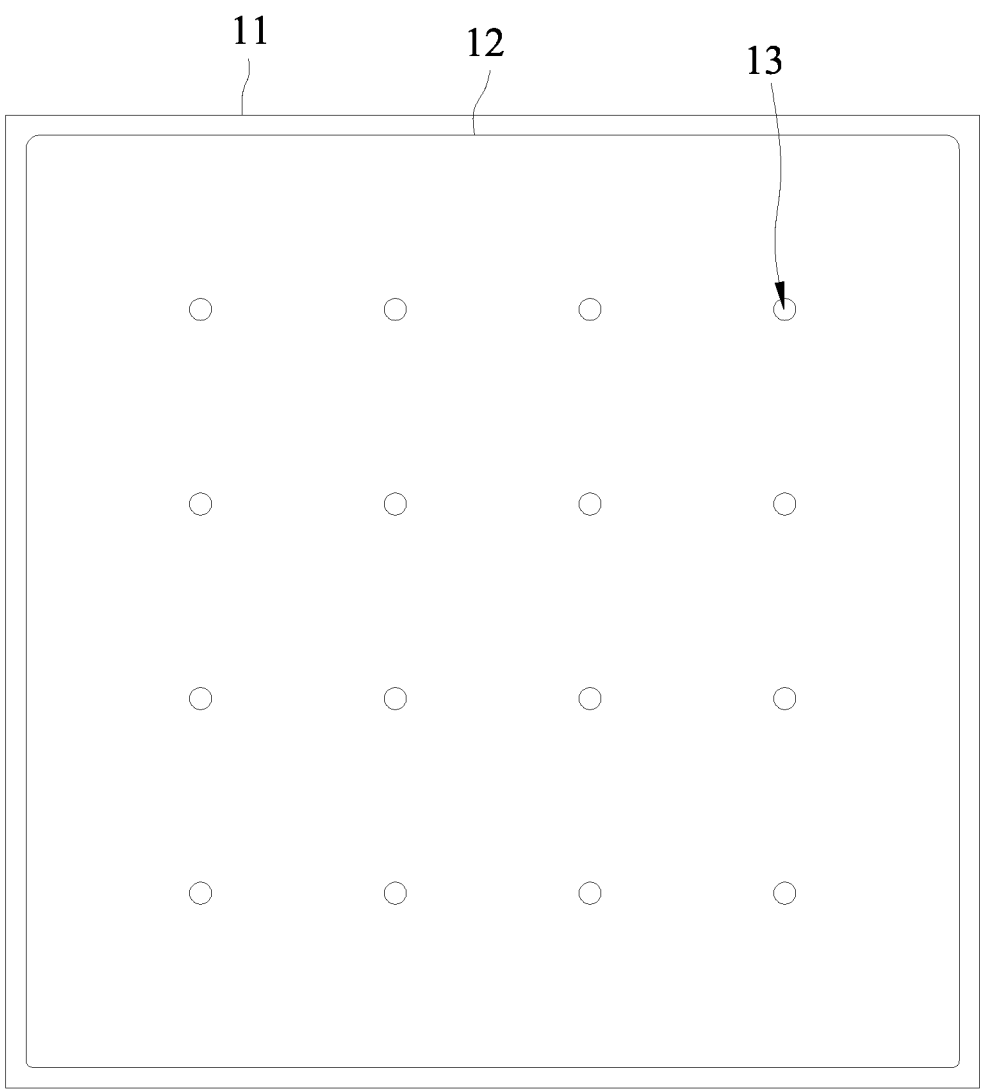
FIGS. 4 to 11 are schematic top views illustrating consecutive steps of a method for manufacturing the first embodiment of the LED according to the disclosure.

Referring to FIG. 4, the epitaxial structure 12 is grown on the substrate 11, and includes the first semiconductor layer 121, the light-emitting layer 123, and the second semiconductor layer 122. Thereafter, the second semiconductor layer 122 and the light-emitting layer 123 are etched sequentially to form a plurality of the via holes 13 to expose the first semiconductor layer 121. In addition, an edge portion of the epitaxial structure 12 may be optionally removed to expose the substrate 11 for a subsequent cutting process.

Figure 5:
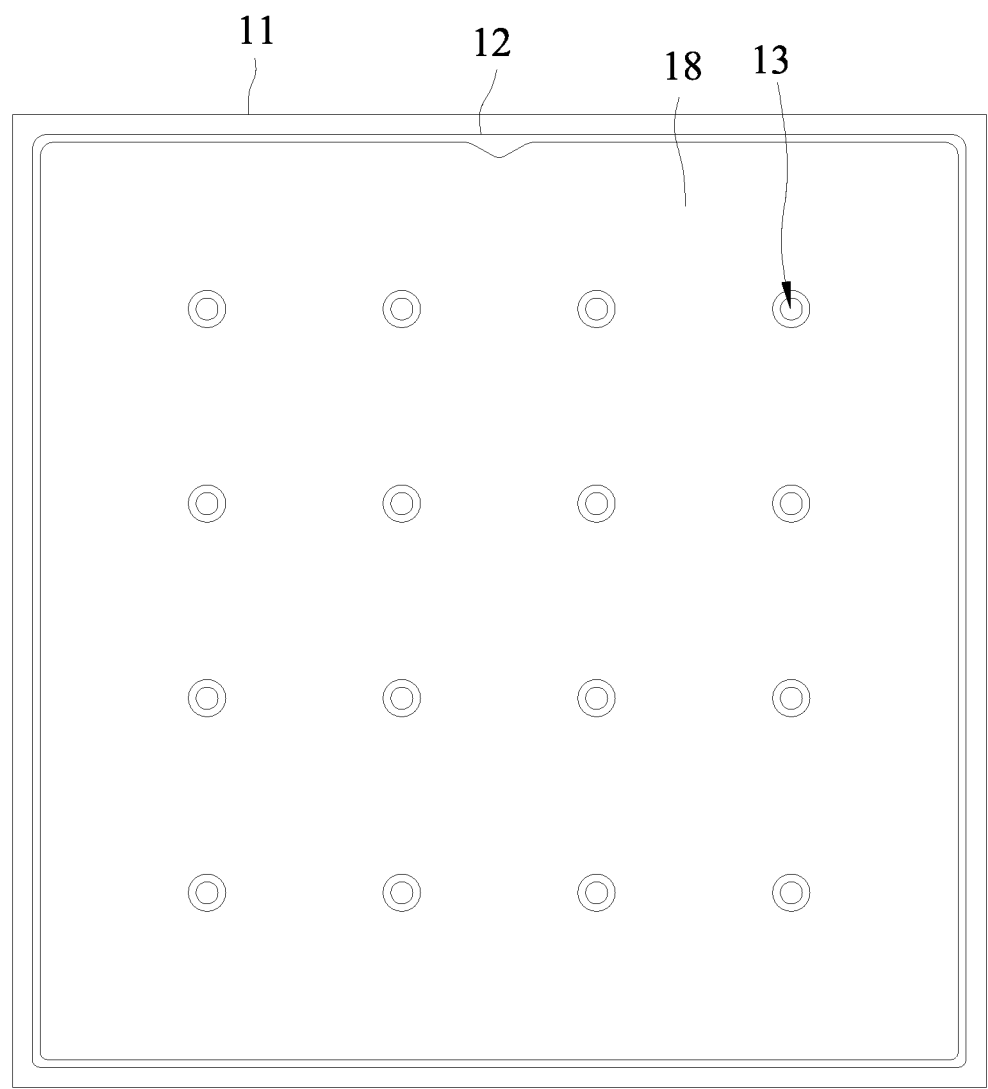

Referring to FIG. 5, the transparent conductive layer 18 is formed on the second semiconductor layer 122 to enhance electrical conductivity. The transparent conductive layer 18 is formed with a plurality of openings, which are disposed respectively to the via holes 13 and each of which has a periphery surrounding a periphery of a corresponding one of the via holes 13, so as to expose the first semiconductor layer 121.

Figure 6:
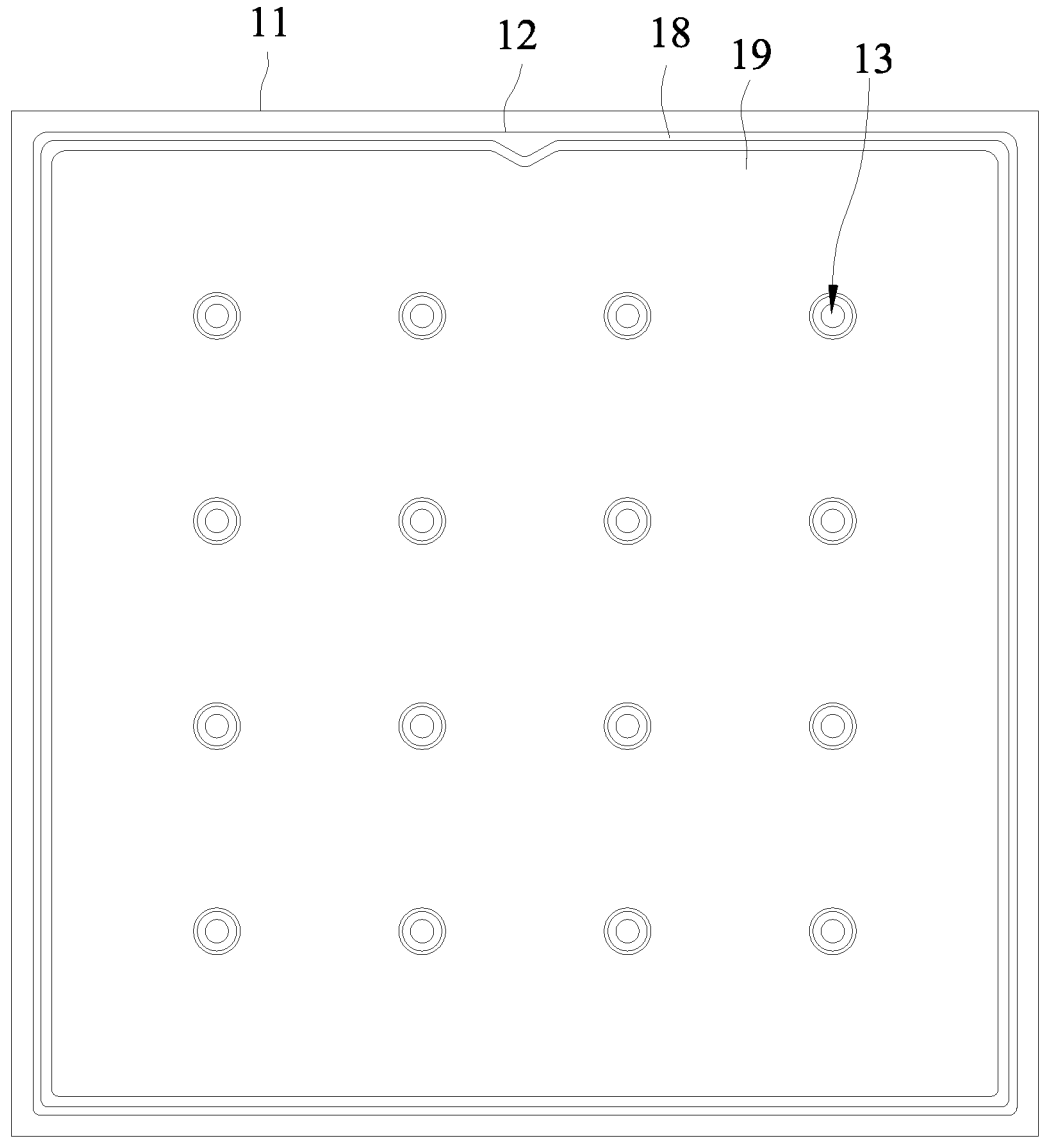

Referring to FIG. 6, the reflective layer 19 is formed on the transparent conductive layer 18 to permit to-be-reflected light to emit through the substrate 11. The reflective layer 19 is a metal reflective layer, and may be formed using a lift-off technique. The reflective layer 19 may be configured as a single-layered or multi-layered structure, which may be formed by an electron beam evaporation process or a magnetron sputtering process. In some embodiments, the reflective layer 19 does not cover the via holes 13 and the edge portion of the substrate 11.

Figure 7:
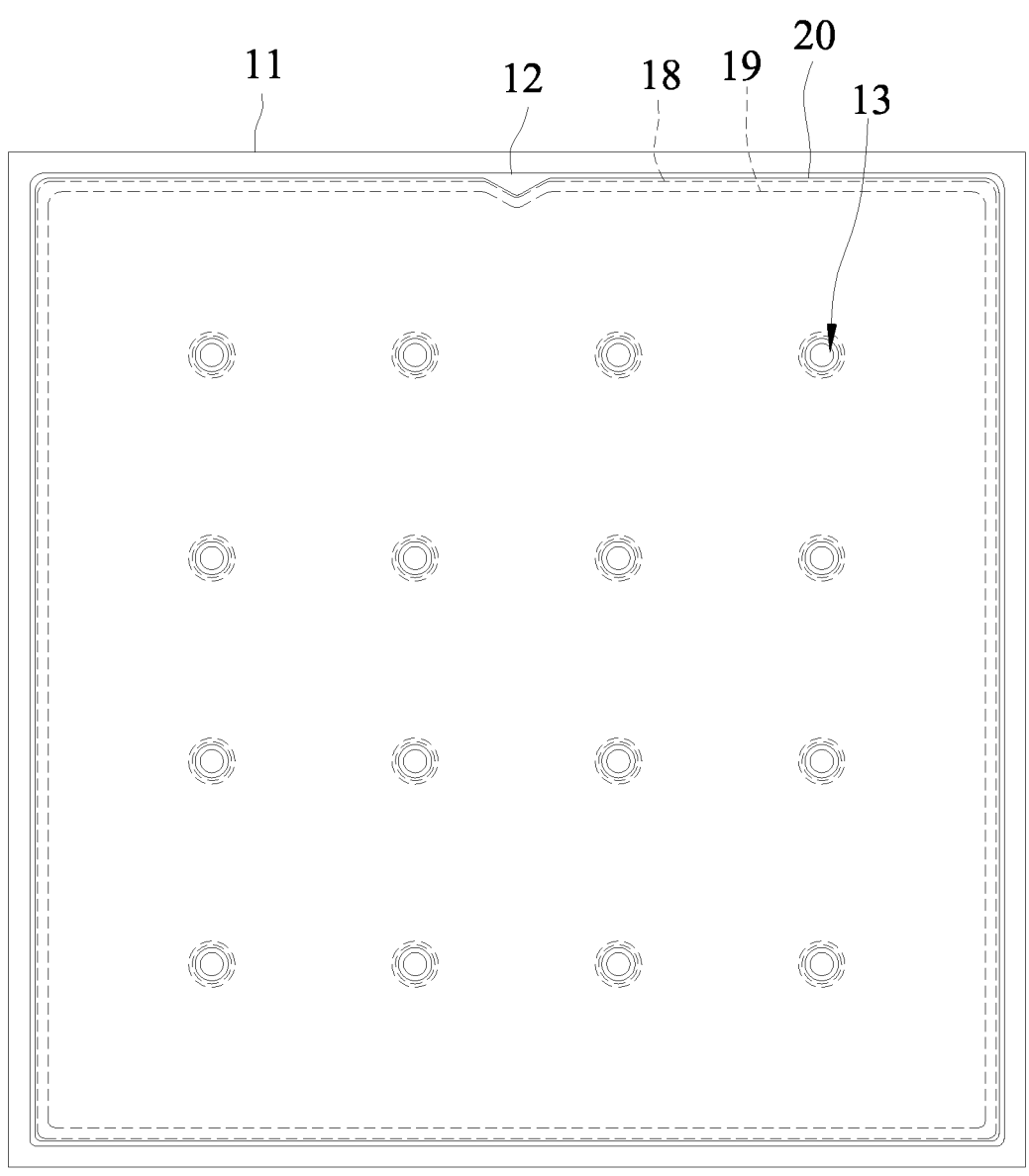

Referring to FIG. 7, the blocking layer 20 is formed on the reflective layer 19 to avoid migration of the material of the reflective layer 19. The blocking layer 20 is formed using a metal material. In some embodiments, the blocking layer 20 is capable of covering the sidewall of the reflective layer 19 so as to entirely cover the reflective layer 19.

Figure 8:
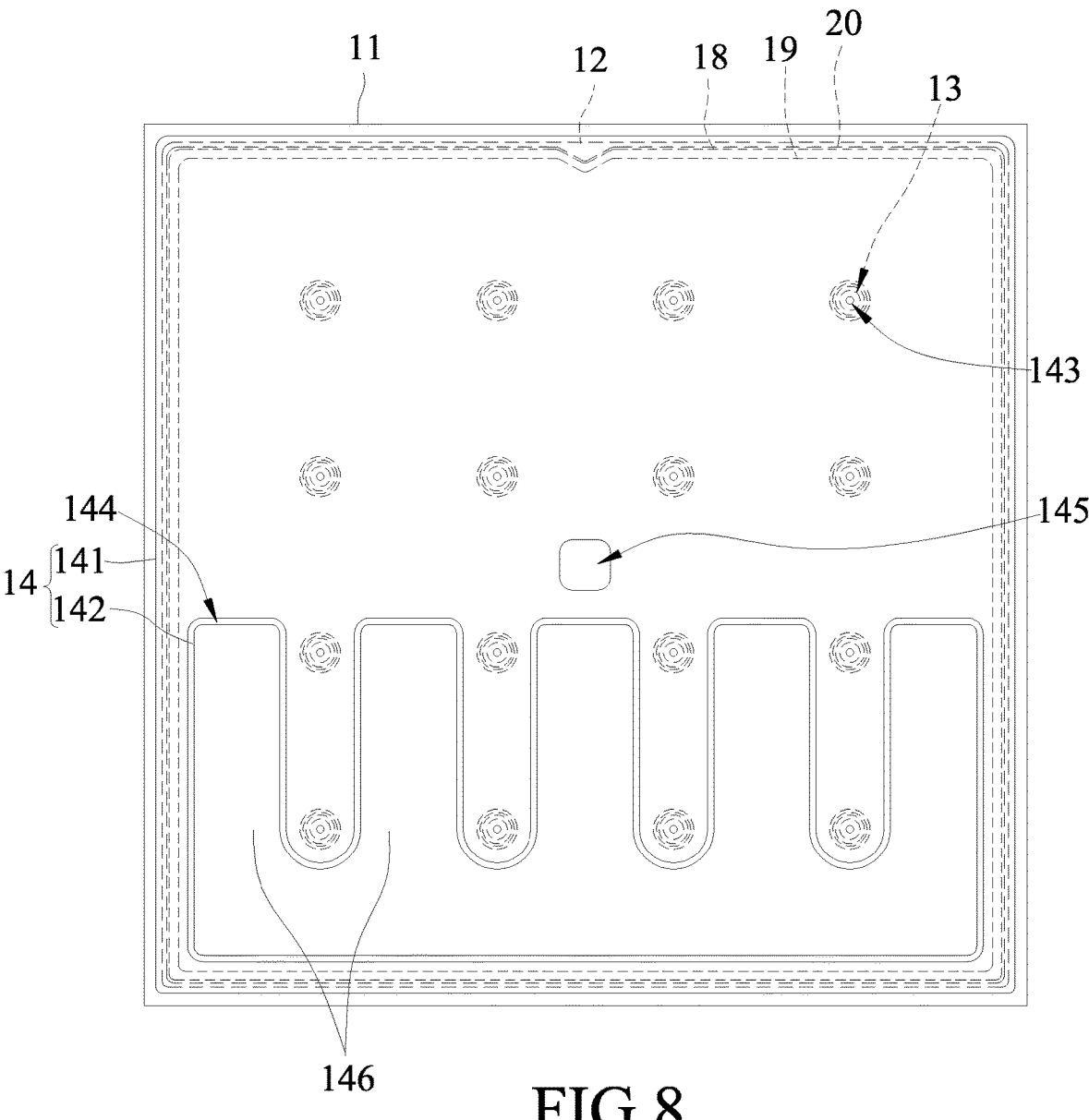

Referring to FIG. 8, the first insulation layer 14 is formed on the blocking layer 20. The first insulation layer 14 may cover a portion of the first semiconductor layer 121, the light-emitting layer 123, the second semiconductor layer 122, and a portion of the blocking layer 20. The first insulation layer 14 is provided with a plurality of the first openings 143, the second opening 144, and the ejector pin opening 145, which are all disposed on the blocking layer 20. The first openings 143 are disposed in the via holes 13, respectively, to expose the first semiconductor layer 121. The second opening 144 and the ejector pin opening 145 are disposed on the blocking layer 20 to expose the blocking layer 20. The ejector pin opening 145 is disposed at a central position of the LED 10.

Figure 9:
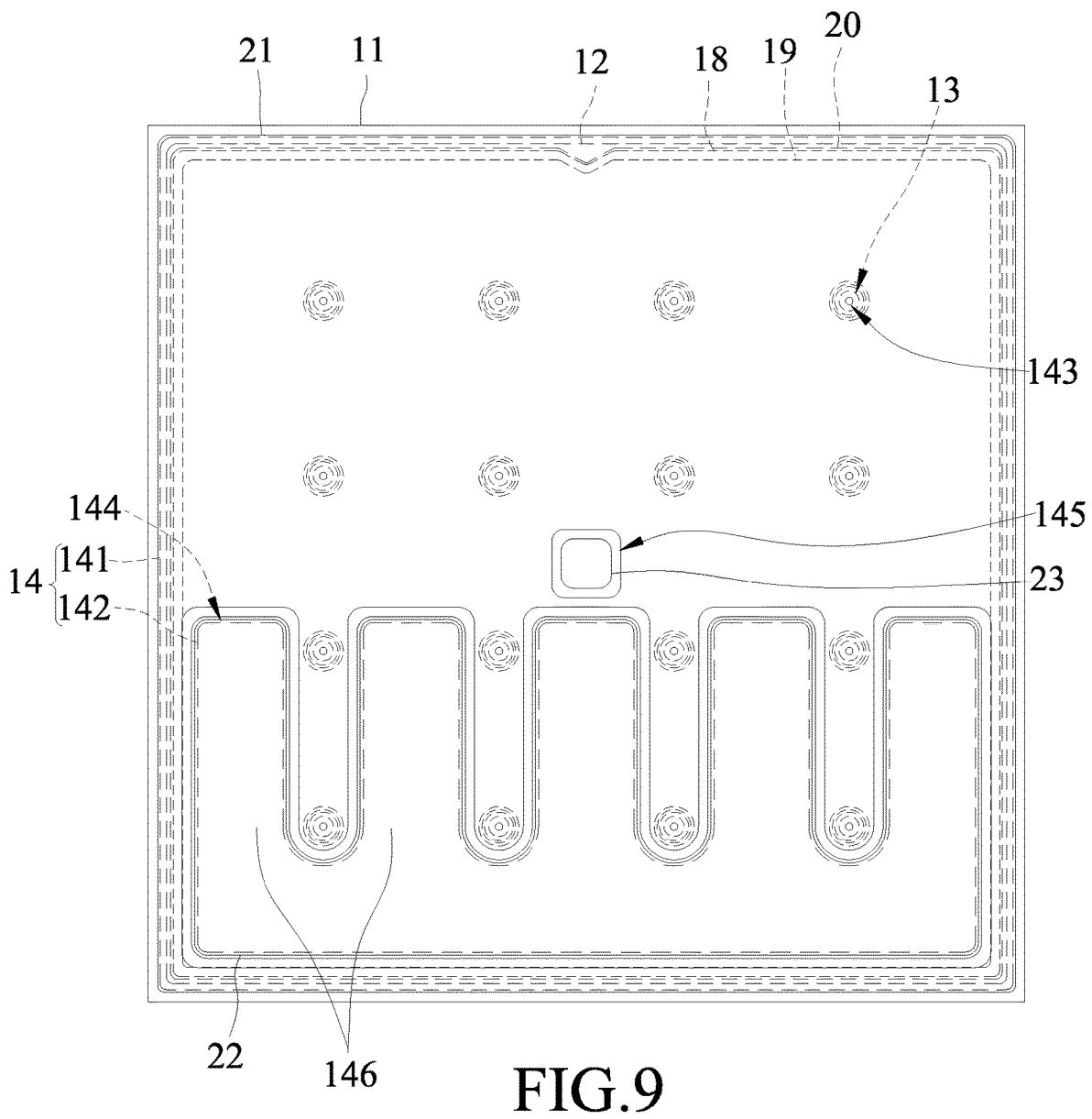

Referring to FIG. 9, the first connecting electrode 21 and the second connecting electrode 22 are formed on the first insulation layer 14. The first connecting electrode 21 and the second connecting electrode 22 are spaced apart from each other by a predetermined distance so as to isolate electricity therebetween. The predetermined distance is a transverse distance between the first connecting electrode 21 and the second connecting electrode shown in FIG. 3. In some embodiments, the predetermined distance ranges from 20 μm to 50 μm. The first connecting electrode 21 and the second connecting electrode 22 may cover the epitaxial structure 12 almost entirely except for the predetermined distance therebetween. The bump 23 is formed in the ejector pin opening 145, and is exclusive for an ejector pin to act on it, while the first connecting electrode 21 and the second connecting electrode 22 are formed. The material for the bump 23 may be the same as that of the first connecting electrode 21 and the second connecting electrode 22, and may be a metal layer. The bump 23 is formed directly on the blocking layer 20 without any insulation layer between the bump 23 and the blocking layer 20.

The ejector pin will act on the bump 23 in a subsequent step for transferring of the LED 10. The force for performing such step may be cushioned by making use of the ductility of the metal layer so as to prevent the first insulation layer 14 from cracking, which may cause leakage. In addition, the bump 23 is spaced apart from the first connecting electrode 21 and the second connecting electrode 22 by a certain distance, and thus no electricity exists among them. In some embodiments, the distance ranges from 10 μm to 30 μm. The bump 23 may be configured as a circular or rectangular shape, and has an area of at least 3500 μm². An upper surface of the bump 23 may be covered by the second insulation layer 16, so as to prevent moisture from entering into the LED 10. The first connecting electrode 21 covers the via holes 13 and the first opening 143, and is electrically connected to the first semiconductor layer 121 through the first opening 143. The second connecting electrode 22 covers at least a portion of the second opening 144, and is electrically connected to the second semiconductor layer 122 through the second opening 144. The via holes 13 and the second connecting electrode 22 do not overlap each other.

Figure 10:
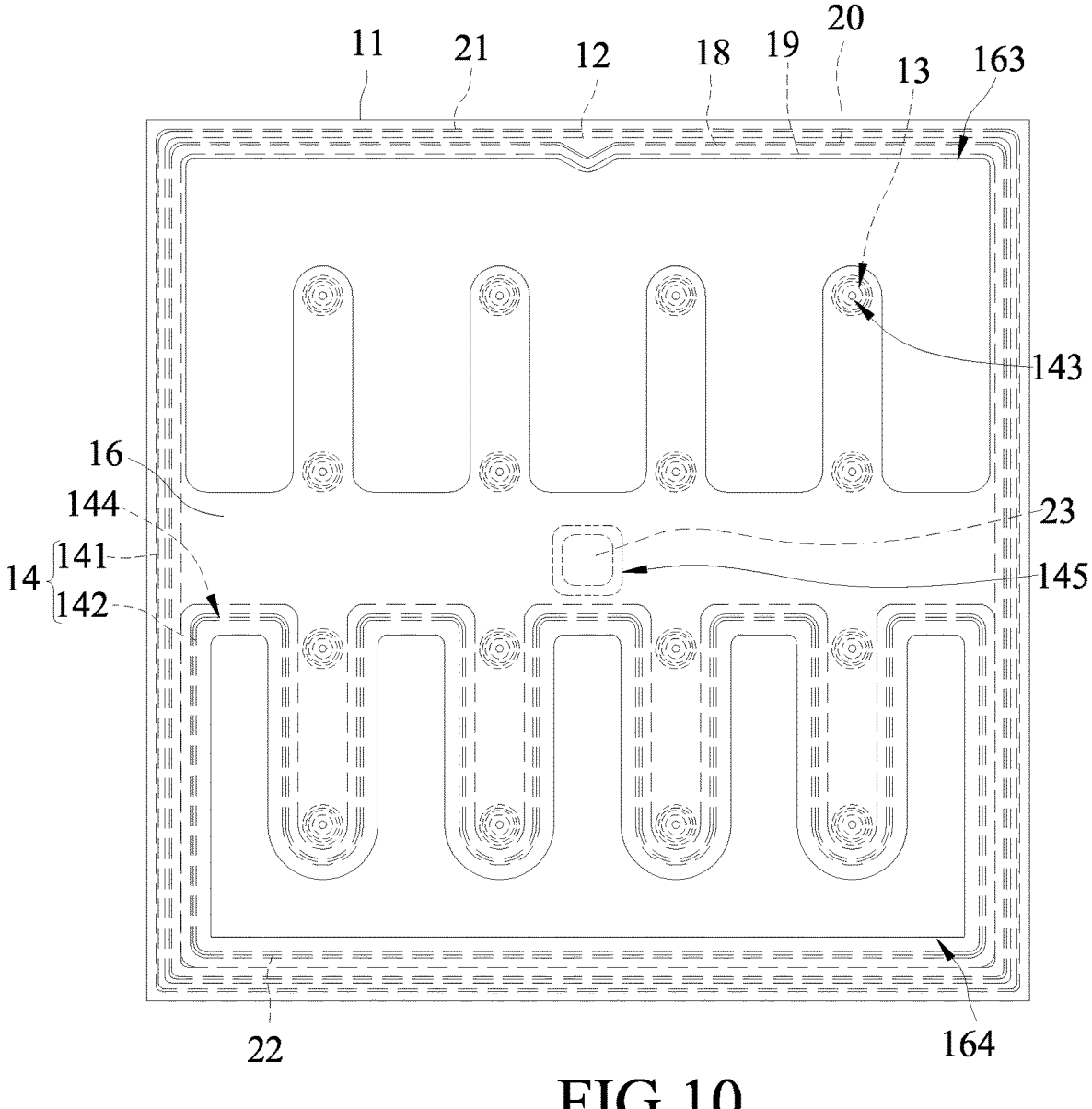

Referring to FIG. 10, the second insulation layer 16 is formed on the first connecting electrode 21 and the second connecting electrode 22. Specifically, the second insulation layer 16 is disposed on the first connecting electrode 21 and the second connecting electrode 22, and covers the first insulation layer 14 and the substrate 11. The second insulation layer 16 is formed with the third opening 163 and the fourth opening 164. The third opening 163 is disposed on the first connecting electrode 21, and the fourth opening 164 is disposed on the second connecting electrode 22. In some embodiments, the fourth opening 164 is formed as a shape that is the same as or similar to that of the second connecting electrode 22, so as to ensure that an edge of the fourth opening 164 fits an edge of the second connecting electrode 22 as closely as possible.

Figure 11:
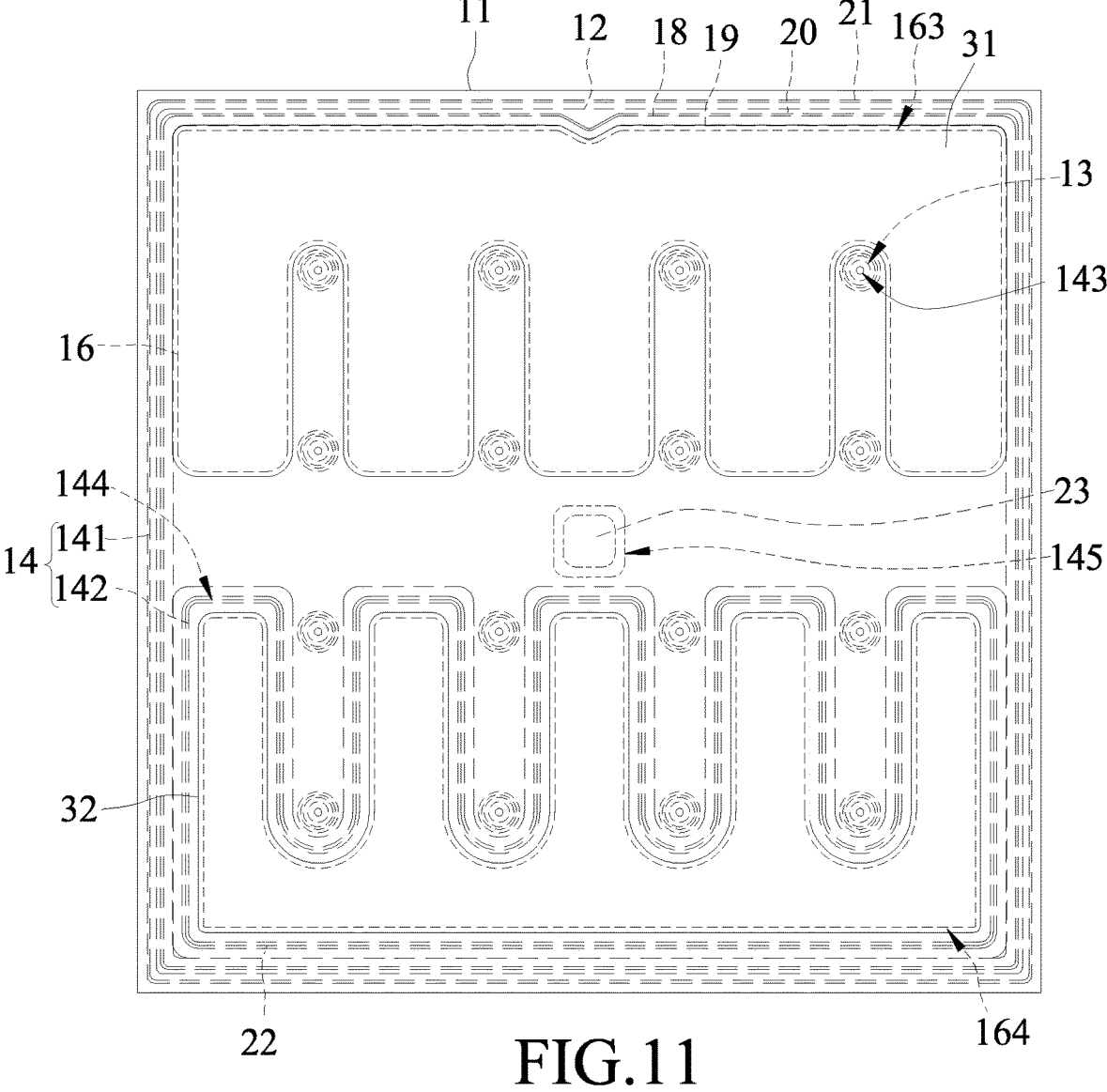

Referring to FIG. 11, the first pad 31 and the second pad 32 are formed on the second insulation layer 16. The first pad 31 and the second pad 32 are disposed on the second insulation layer 16 and are spaced apart from each other by a certain distance. The first pad 31 is electrically connected to the first connecting electrode 21 through the third opening 163, and the second pad 32 is electrically connected to the second connecting electrode 22 through the fourth opening 164. The first pad 31 and the second pad 32 may entirely cover the third opening 163 and the fourth opening 164, respectively.

Figure 12:
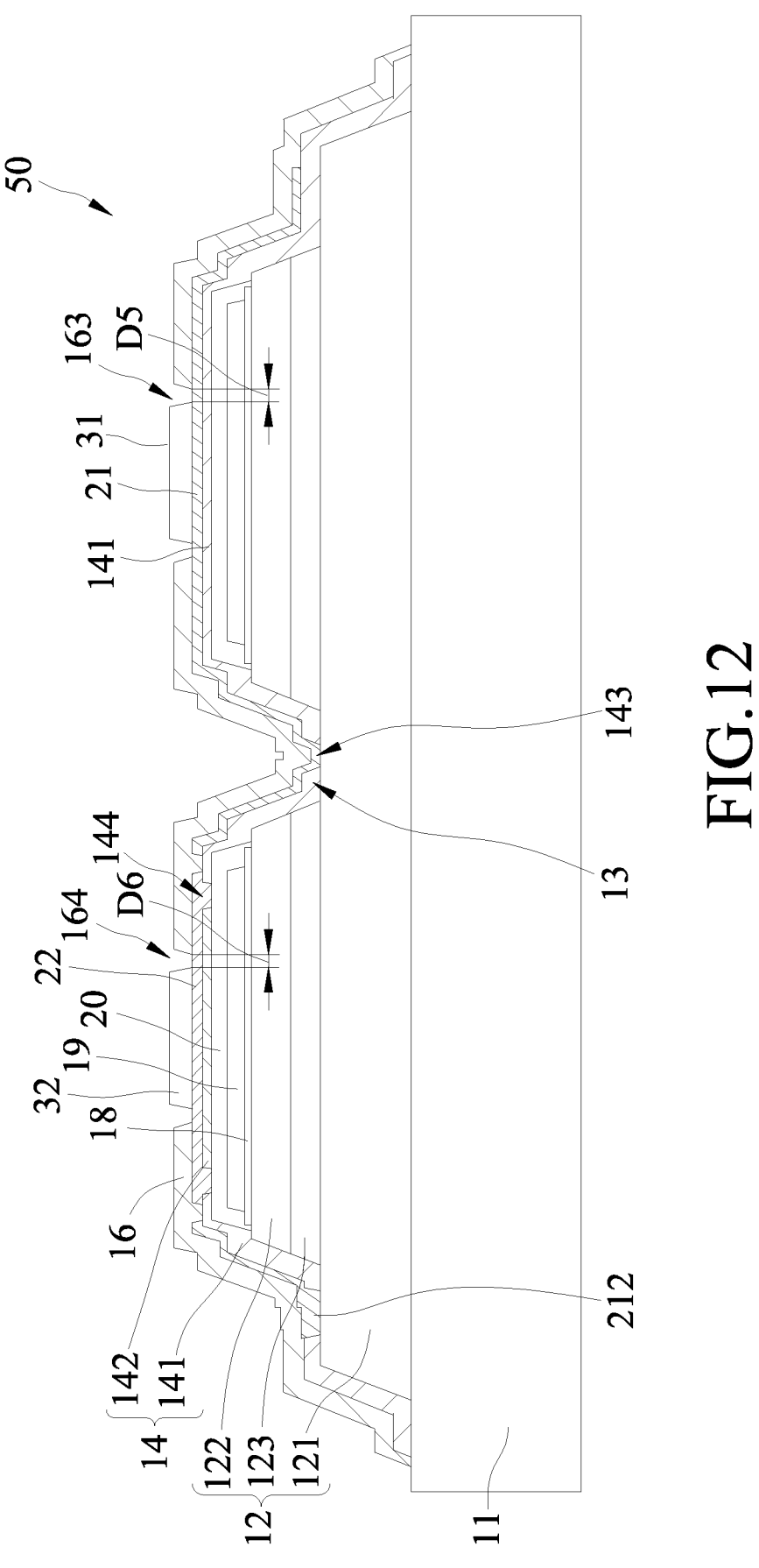
FIG. 12 is a schematic sectional view of a second embodiment of the LED according to the disclosure.

Referring to FIG. 12, a second embodiment of a light-emitting diode (LED) 50 according to the disclosure is similar to the first embodiment of the LED 10 according to the disclosure except for the following differences. The LED 50 further includes an extended electrode 212. The epitaxial structure 12 has a mesa-shaped surface to expose a portion of the first semiconductor layer 121. The extended electrode 212 is provided at an edge portion of the epitaxial structure 12. That is to say, the extended electrode 212 formed as a surrounding shape is provided at the edge portion of the epitaxial structure 12. The extended electrode 212 extends downwardly from a portion of an upper surface of the first insulation portion 141 to cover the portion of the first semiconductor layer 121 at the mesa-shaped surface, so as to provide current spreading and to enhance light-emitting of the LED 50. The extended electrode 212 may be formed by extending the first connecting electrode 21 so as to enhance the current spreading effect.

In addition, the first pad 31 is disposed only on the first connecting electrode 21, and is disposed in the third opening 163 such that the third opening 163 is partially filled with the first pad 31. A distance (D5) is defined between an edge of the first pad 31 and an edge of the third opening 163. The distance (D5) ranges from 1 μm to 6 μm. The second pad 32 is disposed only on the second connecting electrode 22, and is disposed in the fourth opening 164 such that the fourth opening 164 is partially filled with the second pad 32. A distance (D6) is defined between an edge of the second pad 32 and an edge of the fourth opening 164. The distance (D6) ranges from 1 μm to 6 μm, so as to further prevent the first insulation layer 14 or the second insulation layer 16 from cracking, which may result in a partial short-circuit as the metal layers having different polarities and disposed over each other interconnect.

The LED 10, 50 has a length or width ranging from 500 μm to 2000 μm, and a ratio of the length to the width ranges from 1:1 to 2:1.

The disclosure further provides a light-emitting module that uses the LED 10, 50, and the specific structure and the technical effects thereof are not described in detail.

The present disclosure further provides a light-emitting device that uses the LED 10, 50, and the specific structure and the technical effects thereof are not described in detail. The light-emitting device may be a light-emitting device for all luminous purposes.

In addition to the applications described above, the LED 10, 50 may be used in various fields including, for example, but not limited to, general indoor lighting, automotive lighting, and the like. In particular, the requirement of reliability of light-emitting diodes is much higher for automotive lighting.

In summary, the light-emitting diode and the light-emitting device according to the disclosure are provided with the first insulation portion 141 and the second insulation portion 142, such that the upper surface of the first connecting electrode 21 and the upper surface of the second connecting electrode 22 are disposed on the same level so as to ensure that the upper surface of the first pad 31 and the upper surface of the second pad 32 are also on the same level, thereby obtaining the light-emitting diode having high flatness.

The horizontally projected area of the first connecting electrode 21 does not overlap that of the second pad 32, and the horizontally projected area of the second connecting electrode 22 does not overlap that of the first pad 31, so as to prevent the first insulation layer 14 or the second insulation layer 16 from cracking under an external force, which may lead to the phenomenon of partial short-circuit as the metal layers having different polarities and disposed over each other interconnect.

In addition, the proportion of the area of the third opening 163 to that of the first pad 31 is at least 80%, and the proportion of the area of the fourth opening 164 to that of the second pad 32 is at least 80%, such that the performance of overall heat dissipation of the light-emitting diode may be enhanced.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode comprising:

an epitaxial structure including a first semiconductor layer, a light-emitting layer disposed on said first semiconductor layer, and a second semiconductor layer disposed on said light-emitting layer;

at least one via hole extending downwardly from a portion of an upper surface of said second semiconductor layer and through said light-emitting layer to terminate at said first semiconductor layer;

a first insulation layer including a first insulation portion and a second insulation portion, said first insulation portion being disposed over a portion of said second semiconductor layer and extending to a bottom of said at least one via hole, said first insulation portion being formed with at least one first opening disposed at said bottom of said at least one via hole, said second insulation portion being disposed only over a portion of said second semiconductor layer, said first insulation portion being disposed to surround said second insulation portion, said first insulation portion and said second insulation portion being separated from each other by a second opening formed as a shape surrounding said second insulation portion;

a first connecting electrode disposed on said first insulation portion and electrically connected to said first semiconductor layer through said at least one first opening;

a second connecting electrode covering an upper surface and a sidewall of said second insulation portion and electrically connected to said second semiconductor layer through said second opening, an upper surface of said second connecting electrode being on the same level as that of said first connecting electrode;

a second insulation layer disposed on said first connecting electrode and said second connecting electrode, and provided with a third opening and a fourth opening;

a first pad disposed on said first connecting electrode, and electrically connected to said first connecting electrode through said third opening; and a second pad disposed on said second connecting electrode, and electrically connected to said second connecting electrode through said fourth opening;

a reflective layer provided over said second semiconductor layer; and a blocking layer covering said reflective layer, wherein vertical projection of said at least one via hole on an upper surface of said first semiconductor layer does not overlap vertical projection of each of said first pad and said second pad on said upper surface of said first semiconductor layer, and wherein said first insulation portion and said second insulation portion cover said blocking layer, said second opening exposes a portion of said blocking layer, and said second connecting electrode is electrically connected to said blocking layer through said second opening.

2. The light-emitting diode according to claim 1, wherein said first insulation portion has a thickness ranging from 0.8 µm to 1.5 µm.

3. The light-emitting diode according to claim 1, wherein said second insulation portion does not overlap said at least one via hole.

4. The light-emitting diode according to claim 1, wherein a horizontally projected area of said second insulation portion is at least 50% of that of said second connecting electrode, and is less than 100% of that of said second connecting electrode.

5. The light-emitting diode according to claim 1, wherein a horizontally projected area of said second insulation portion is 30% to 70% of that of said first insulation portion.

6. The light-emitting diode according to claim 1, wherein a proportion of a horizontally projected area of said second pad to that of said second connecting electrode is less than 100%.

7. The light-emitting diode according to claim 6, wherein a second distance is defined between an edge of said second connecting electrode and an edge of said second pad, and ranges from 15 µm to 50 µm.

8. The light-emitting diode according to claim 1, wherein a proportion of a horizontally projected area of said third opening to that of said first pad is greater than 100% and up to 110%.

9. The light-emitting diode according to claim 1, wherein a first distance is defined between said first insulation portion and said second insulation portion and ranges from 5 µm to 20 µm.

10. The light-emitting diode according to claim 1, wherein a third distance is defined between said first connecting electrode and said second connecting electrode, and ranges from 10 µm to 50 µm.

11. The light-emitting diode according to claim 1, wherein a proportion of a horizontally projected area of said reflective layer to that of said second semiconductor layer is at least 80%.

12. The light-emitting diode according to claim 1, wherein said second insulation portion includes a plurality of protrusion parts extending horizontally toward said first pad, at least one of said via holes being provided between two adjacent ones of said protrusion parts.

13. The light-emitting diode according to claim 1, wherein said second connecting electrode is configured as a shape the same as that of said second insulation portion.

14. The light-emitting diode according to claim 1, wherein said second pad covers said second insulation layer, and a fourth distance is defined between an edge of said second pad and an edge of said fourth opening, said fourth distance being ranges from 5 µm to 20 µm.

15. The light-emitting diode according to claim 1, further comprising an extended electrode, which is formed by extending said first connecting electrode.

16. The light-emitting diode according to claim 1, wherein said second connecting electrode entirely covers said second insulation portion.

17. A light-emitting device comprising the light-emitting diode according to claim 1.

* * * * *